United States Patent
Hosoi et al.

(10) Patent No.: US 12,351,698 B2
(45) Date of Patent: Jul. 8, 2025

(54) RESIN COMPOSITION, COPPER FOIL WITH RESIN, DIELECTRIC LAYER, COPPER-CLAD LAMINATE, CAPACITOR ELEMENT, AND PRINTED WIRING BOARD WITH BUILT-IN CAPACITOR

(71) Applicant: MITSUI MINING & SMELTING CO., LTD., Tokyo (JP)

(72) Inventors: Toshihiro Hosoi, Ageo (JP); Kenshiro Fukuda, Ageo (JP); Yoshihiro Yoneda, Ageo (JP); Tomohiro Ishino, Ageo (JP); Tetsuro Sato, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 69 days.

(21) Appl. No.: 17/442,339

(22) PCT Filed: Feb. 7, 2020

(86) PCT No.: PCT/JP2020/004882
§ 371 (c)(1),
(2) Date: Sep. 23, 2021

(87) PCT Pub. No.: WO2020/195236
PCT Pub. Date: Oct. 1, 2020

(65) Prior Publication Data
US 2022/0162418 A1    May 26, 2022

(30) Foreign Application Priority Data
Mar. 27, 2019    (JP) .................. 2019-059816

(51) Int. Cl.
*C08K 3/22*    (2006.01)
*B32B 15/04*    (2006.01)
(Continued)

(52) U.S. Cl.
CPC .............. *C08K 3/22* (2013.01); *B32B 15/043* (2013.01); *B32B 15/20* (2013.01); *C08L 63/00* (2013.01);
(Continued)

(58) Field of Classification Search
CPC .................................................. C09D 163/00
See application file for complete search history.

(56) References Cited

U.S. PATENT DOCUMENTS 6,426,146 B1 * 7/2002 Ameen .................. C23C 26/00
428/548
6,657,849 B1    12/2003 Andresakis et al.
(Continued)

FOREIGN PATENT DOCUMENTS

JP    05-208469    8/1993
JP    09-291473    11/1997
(Continued)

OTHER PUBLICATIONS

Thermosetting Resin Composition for Circuit Board. JP 2011219674 A (Year: 2011).*

*Primary Examiner* — Ian A Rummel
(74) *Attorney, Agent, or Firm* — GREENBLUM & BERNSTEIN P.L.C.

(57) ABSTRACT

There is provided a resin composition that can greatly improve voltage endurance while ensuring high capacitance and excellent circuit adhesion, when used as the dielectric layer of a capacitor. This resin composition includes a binder component including bisphenol S, an epoxy resin curing agent having a phenolic hydroxyl group, and an epoxy resin; and a dielectric filler.

17 Claims, 1 Drawing Sheet

(51) Int. Cl.
*B32B 15/20* (2006.01)
*C08L 63/00* (2006.01)
*H01G 4/14* (2006.01)

(52) U.S. Cl.
CPC ............ *H01G 4/14* (2013.01); *B32B 2255/06* (2013.01); *B32B 2255/26* (2013.01); *B32B 2307/204* (2013.01); *B32B 2307/732* (2013.01); *B32B 2457/08* (2013.01); *B32B 2457/16* (2013.01); *C08K 2003/2206* (2013.01); *C08K 2003/2237* (2013.01); *C08L 2203/20* (2013.01)

(56) References Cited

U.S. PATENT DOCUMENTS

2007/0049485 A1* 3/2007 Tanabe ................. C01G 23/006
 524/413
2011/0108309 A1 5/2011 Peiffer

FOREIGN PATENT DOCUMENTS

| JP | 2002-064111 | 2/2002 |
| JP | 2002-164253 | 6/2002 |
| JP | 2002-309200 | 10/2002 |
| JP | 2006-123232 | 5/2006 |
| JP | 2011-219674 | 11/2011 |
| JP | 2014-012751 | 1/2014 |
| JP | 5716033 B | 3/2015 |
| JP | 2017-193655 | 10/2017 |
| WO | 2018/003590 | 1/2018 |

\* cited by examiner

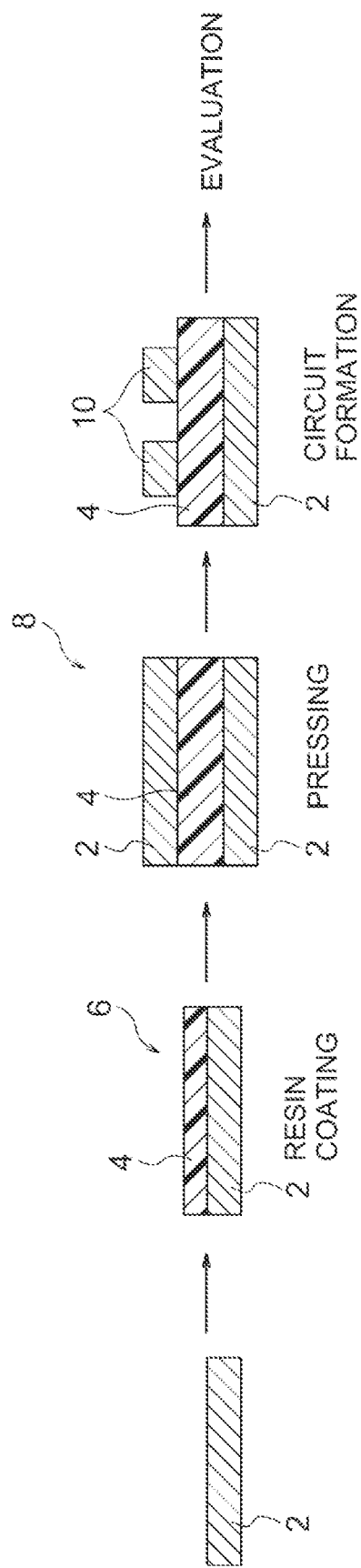

RESIN COMPOSITION, COPPER FOIL WITH RESIN, DIELECTRIC LAYER, COPPER-CLAD LAMINATE, CAPACITOR ELEMENT, AND PRINTED WIRING BOARD WITH BUILT-IN CAPACITOR

TECHNICAL FIELD

The present invention relates to a resin composition, a resin-attached copper foil, a dielectric layer, a copper-clad laminate, a capacitor element, and a capacitor-built-in printed wiring board.

BACKGROUND ART

As a resin composition used for the manufacture of a copper-clad laminate or a printed wiring board, a resin composition for a capacitor-built-in printed wiring board is known. Such a resin composition functions as a dielectric layer in a capacitor by being cured.

For example, Patent Literature 1 (JP2002-164253A) discloses a capacitor material in which a dielectric layer composed of a first dielectric layer and a second dielectric layer is sandwiched between a first electrically conductive layer and a second electrically conductive layer, and states that the first dielectric layer and/or the second dielectric layer are composed of a polymer resin such as a polyimide resin including a filler such as barium titanate.

Patent Literature 2 (JP5716033B) discloses an electrical article having a polymer dielectric composition including about 10% by weight or more and about 60% by weight or less of an epoxy resin, about 20% by weight or more and about 90% by weight or less of a dielectric filler, and about 0.1% by weight or more and about 10% by weight or less of a diaminodiphenyl sulfone curing agent.

Patent Literature 3 (JP2002-309200A) discloses an adhesive film in which an epoxy resin composition containing (A) an aromatic epoxy resin which is liquid at ordinary temperature and has two or more epoxy groups in one molecule, (B) an epoxy curing agent, (C) a phenoxy resin having a weight average molecular weight of 5000 or more and 100000 or less, and (D) a high dielectric constant inorganic filler is layer-formed on a supporting base film, and also states that the (C) component has a bisphenol S skeleton and that the (D) component can be barium titanate.

CITATION LIST

Patent Literature

Patent Literature 1: JP2002-164253A
Patent Literature 2: JP5716033B
Patent Literature 3: JP2002-309200A

SUMMARY OF INVENTION

Printed wiring boards are widely used in electronic communication equipment such as portable electronic equipment. Particularly, with the weight and size reduction and high functionalization of portable electronic communication equipment and the like, the reduction of noise in printed wiring boards, and the like become problems. In order to enable noise reduction, a capacitor is important, and in order to achieve performance enhancement, for such a capacitor, miniaturization and thinning to the extent that it is incorporated into an inner layer of a printed wiring board are desired. With this, high capacitance is desired. Therefore, in the performance enhancement of electronic communication equipment such as portable electronic equipment, it is desired for a capacitor built-in a printed wiring board to ensure high capacitance without increasing its thickness. In addition, it is also desired for a capacitor to ensure adhesion between a resin layer (dielectric layer) and a circuit (that is, circuit adhesion) and voltage endurance.

The resin for a dielectric layer as disclosed in Patent Literature 1 (JP2002-164253A) includes a polymer such as a polyimide resin, and such a polymer component has a large molecular weight and therefore has low fluidity. Therefore, high pressure needs to be applied during pressing, and as a result, the load on the processing apparatus increases. On the other hand, when the polymer component is eliminated, the circuit adhesion is likely to decrease. Moreover, the circuit adhesion and the voltage endurance are in a trade-off relationship, and it is essentially difficult to achieve both at the same time. Therefore, desired is a resin composition that can achieve high capacitance, excellent circuit adhesion, and excellent voltage endurance even without a polymer (or even with a low polymer content).

The present inventors have now discovered that the use of a resin composition including bisphenol S, an epoxy resin curing agent having a phenolic hydroxyl group, and an epoxy resin together with a dielectric filler, as the dielectric layer of a capacitor, can greatly improve the voltage endurance while ensuring high capacitance and excellent circuit adhesion.

Therefore, it is an object of the present invention to provide a resin composition that can greatly improve voltage endurance while ensuring high capacitance and excellent circuit adhesion, when used as the dielectric layer of a capacitor.

According to an aspect of the present invention, there is provided a resin composition comprising:
  a binder component comprising bisphenol S, an epoxy resin curing agent having a phenolic hydroxyl group, and an epoxy resin; and
  a dielectric filler.

According to another aspect of the present invention, there is provided a resin-attached copper foil comprising a copper foil and the resin composition provided on at least one surface of the copper foil.

According to another aspect of the present invention, there is provided a dielectric layer being a layer of the resin composition that is cured.

According to another aspect of the present invention, there is provided a copper-clad laminate comprising a first copper foil, the dielectric layer, and a second copper foil in sequence.

According to another aspect of the present invention, there is provided a capacitor element comprising the dielectric layer.

According to another aspect of the present invention, there is provided a capacitor-built-in printed wiring board comprising the dielectric layer.

BRIEF DESCRIPTION OF DRAWING

FIG. 1 is a diagram showing the steps of fabricating a resin-attached copper foil, a copper-clad laminate, and a circuit for evaluation in Examples 1 to 11.

DESCRIPTION OF EMBODIMENTS

Resin Composition
The resin composition of the present invention includes a binder component and a dielectric filler. This binder component includes bisphenol S, an epoxy resin curing agent having a phenolic hydroxyl group, and an epoxy resin. The use of a resin composition including bisphenol S, an epoxy resin curing agent having a phenolic hydroxyl group, and an epoxy resin together with a dielectric filler in this manner, as the dielectric layer of a capacitor, can greatly improve the voltage endurance while ensuring high capacitance and excellent circuit adhesion.

As described above, conventional resin compositions including polymers have low fluidity, and high pressure needs to be applied during pressing, and as a result, the load on the processing apparatus increases. On the other hand, when the polymer is eliminated, the circuit adhesion is likely to decrease. Moreover, the circuit adhesion and the voltage endurance are in a trade-off relationship, and it is essentially difficult to achieve both at the same time. In this respect, in the resin composition of the present invention, the above problem associated with the use of a polymer can be solved by blending bisphenol S as it is (without previously polymerizing it), as an unreacted monomer, with an epoxy resin and the like. As a result, according to the resin composition of the present invention, a capacitor that exhibits high capacitance, excellent circuit adhesion, and excellent voltage endurance even without a polymer (or even with a low polymer content) can be achieved.

Bisphenol S is a compound blended into the resin composition of the present invention as an unreacted monomer and provides the advantage of being able to achieve the above-described various properties of the present invention without a polymer or with a low polymer content. In other words, bisphenol S is generally polymerized in the form of a bisphenol S type phenoxy resin or the like and blended into a resin composition, but in the resin composition of the present invention, bisphenol S is blended as it is, as a monomer, on purpose. The mechanism by which bisphenol S contributes to the achievement of the above-described various properties is not necessarily certain, but it is considered that the sulfur atom included in the molecule of bisphenol S is excellent in adhesion to copper, and therefore excellent circuit adhesion to a copper foil can be achieved even if no polymer is added to the resin composition. When a polymer obtained by previously reacting bisphenol S with an epoxy resin is used in the resin composition, the softening point of the epoxy resin increases, and therefore not only does the solubility in a solvent worsen, but the processability during pressing is poor (for example, an increase in the apparatus load, and the occurrence of voids).

The content of bisphenol S in the resin composition is preferably 20 parts by weight or more and 40 parts by weight or less, more preferably 20 parts by weight or more and 37 parts by weight or less, further preferably 25 parts by weight or more and 37 parts by weight or less, and particularly preferably 25 parts by weight or more and 35 parts by weight or less based on 100 parts by weight of the binder component. When the content of bisphenol S is within these ranges, the above-described various properties (particularly circuit adhesion) can be more effectively achieved. It is desired that an epoxy resin in an amount corresponding to the phenolic hydroxyl group concentration of bisphenol S is blended into the resin composition of the present invention. In this respect, when the content of bisphenol S exceeds 40 parts by weight, an aliphatic epoxy resin or an alicyclic epoxy resin having a high epoxy group concentration needs to be used in order to add an epoxy resin in an amount corresponding to the phenolic hydroxyl group concentration of bisphenol S, because the absolute amount is insufficient with a general epoxy resin such as a bisphenol A type epoxy resin, a bisphenol F type epoxy resin, or a novolac phenol type epoxy resin. However, the aliphatic epoxy resin or the alicyclic epoxy resin has no aromatic ring in the molecule, and therefore a resin composition using such an epoxy resin is poor in heat resistance, and problems such as blistering are likely to occur in soldering performed in a general printed wiring board production process.

The epoxy resin curing agent having a phenolic hydroxyl group is not particularly limited as long as it functions as a curing agent for the epoxy resin and can be used for electrical and electronic material applications. The epoxy resin curing agent having a phenolic hydroxyl group preferably has three or more phenolic hydroxyl groups per molecule. The use of the epoxy resin curing agent having a phenolic hydroxyl group can greatly improve the voltage endurance of a dielectric layer obtained by curing the resin composition. Examples of the epoxy resin curing agent having a phenolic hydroxyl group include phenol novolac resins, cresol novolac resins, bisphenol A, allylated bisphenol A, bisphenol F, novolac resins of bisphenol A, and vinylphenol copolymerized resins. Further examples of the epoxy resin curing agent having a phenolic hydroxyl group include triazine ring-containing novolac resins, which are polycondensates of the above-described phenols, aldehydes, and compounds having a triazine ring, and are preferably naphthol/cresol type phenol resins (manufactured by Meiwa Plastic Industries, Ltd., MEH-7000), trisphenolmethane type phenol resins (manufactured by Meiwa Plastic Industries, Ltd., MEH-7500), biphenylaralkyl type phenol resins (manufactured by Meiwa Plastic Industries, Ltd., MEHC-7851), phenol novolac resins (manufactured by DIC CORPORATION, TD-2090), poly-p-vinylphenol resins (manufactured by Maruzen Petrochemical Co., Ltd., MARUKA LYNCUR M), and the like and particularly preferably trisphenolmethane type phenol resins. The content of the epoxy resin curing agent having a phenolic hydroxyl group in the resin composition is preferably 1 part by weight or more and 25 parts by weight or less, more preferably 2 parts by weight or more and 20 parts by weight or less, and further preferably 3 parts by weight or more and 18 parts by weight or less based on 100 parts by weight of the binder component. The content of the epoxy resin curing agent having a phenolic hydroxyl group can be appropriately determined according to the content of bisphenol S and the content of the epoxy resin determined by the balance with the content of bisphenol S.

The epoxy resin is not particularly limited as long as it is a monomer or oligomer that has two or more epoxy groups in the molecule and can be used for electrical and electronic material applications. As described above, the epoxy resin is blended into the resin composition of the present invention in a state unreacted with bisphenol S. The content of the epoxy resin in the resin composition should be appropriately determined by the balance with the content of bisphenol S and is not particularly limited but is preferably 30 parts by weight or more and 80 parts by weight or less, more preferably 40 parts by weight or more and 70 parts by weight or less, based on 100 parts by weight of the binder component. Examples of the epoxy resin include bisphenol A type epoxy resins, bisphenol F type epoxy resins, bisphenol S type epoxy resins, phenol novolac type epoxy resins, biphenyl type epoxy resins, biphenylaralkyl type epoxy resins, biphenyl novolac type epoxy resins, cresol novolac type epoxy resins, alicyclic epoxy resins, glycidylamine type epoxy resins, naphthalene type epoxy resins, anthracene type epoxy resins, dicyclopentadiene type epoxy resins, and any combination thereof. In terms of decreasing the load on the processing apparatus during pressing, low molecular weight epoxy resins liquid at ordinary temperature (for example, 25° C.) are preferred. In terms of maintaining the heat resistance of the cured product, aromatic epoxy resins or polyfunctional epoxy resins are preferred, and bisphenol A type epoxy resins, phenol novolac type epoxy resins, naphthalene type epoxy resins, cresol novolac type epoxy resins, or biphenyl novolac type epoxy resins are more preferred.

As described above, with the resin composition of the present invention, a capacitor that exhibits high capacitance, excellent circuit adhesion, and excellent voltage endurance even without a polymer (or even with low polymer content) can be achieved. Therefore, the resin composition of the present invention can be those including no polymer component. Particularly, the constituents of the resin composition of the present invention all have low molecular weights compared with polymers having large molecular weights, and therefore the fluidity of the resin composition is high. Therefore, high pressure need not be applied during pressing when the resin composition is cured, and the load on the processing apparatus can be decreased. For example, due to the elimination of polymer components, a resin composition according to a preferred mode of the present invention can be processed without causing voids, even if subjected to pressing at 5 kgf/cm$^2$ and 70° C. for 5 minutes without evacuation.

However, the resin composition of the present invention may further include a polymer component before curing, as needed. By further including the polymer component, the circuit adhesion can be improved. Therefore, the content of the polymer component in the resin composition is preferably 0 parts by weight or more and less than 30 parts by weight, more preferably 0 parts by weight or more and 25 parts by weight or less, further preferably 0 parts by weight or more and 20 parts by weight or less, particularly preferably 0 parts by weight or more and 15 parts by weight or less, and most preferably 0 parts by weight or more and 10 parts by weight or less based on 100 parts by weight of the binder component. When the content of the polymer component is within the above ranges, high pressure need not be applied during the pressing of the resin composition, and the load on the processing apparatus can be decreased, while the circuit adhesion is improved.

The polymer component is not particularly limited as long as it can be used for electrical and electronic material applications. Examples of preferred polymer components include polyimide resins, polyamide resins, polyamide-imide resins, and any combination thereof.

The polyimide resin is not particularly limited as long as the desired dielectric properties, adhesion, and heat resistance are obtained. In terms of being able to form a varnish and a coating in which the polyimide resin is well compatibilized with the epoxy resin, a polyimide resin soluble in an organic solvent (hereinafter referred to as an organic solvent-soluble polyimide) is preferred. This organic solvent in which the polyimide resin is soluble preferably has a solubility parameter (SP value) of 7.0 or more and 17.0 or less. Preferred examples of such an organic solvent include methyl ethyl ketone, toluene, xylene, N-methylpyrrolidone, dimethylacetamide, dimethylformamide, cyclopentanone, cyclohexanone, cyclohexane, methylcyclohexane, ethylene glycol, ethylene glycol dimethyl ether, ethylene glycol acetate, and any combination thereof. Particularly, in terms of maintaining heat resistance after curing, a polyimide resin having, at a molecular end or in a side chain, at least one functional group capable of reacting with an epoxy group is preferably used. Specifically, the polyimide resin preferably has, as a functional group at its end or in its side chain, at least one functional group selected from the group consisting of a carboxyl group, a sulfonic acid group, a thiol group, and a phenolic hydroxyl group. By having such a functional group, the organic solvent solubility of the polyimide resin and the compatibility of the polyimide resin with the epoxy resin improve. In addition, during heat treatment, the polymerization reaction with the epoxy resin is promoted, and further the polymerization reaction of the polyimide resins with each other is promoted, and thus a cured product having higher heat resistance can be obtained. In this respect, a polyimide resin having a carboxyl group as a functional group at an end or in a side chain is more preferably used.

Examples of the polyamide resins include aromatic polyamide resins. For example, the aromatic polyamide resin contributes to the improvement of the heat resistance of the resin layer. The aromatic polyamide resin is synthesized by the polycondensation of an aromatic diamine and a dicarboxylic acid. Examples of the aromatic diamine used for the polycondensation include 3,4'-diaminodiphenyl ether, 4,4'-diaminodiphenyl ether, 4,4'-diaminodiphenylmethane, 3,3'-diaminodiphenyl sulfone, m-xylenediamine, 3,3-'-oxydianiline, and any combination thereof. Examples of the dicarboxylic acid used for the polycondensation include oxalic acid, malonic acid, succinic acid, glutaric acid, adipic acid, pimelic acid, suberic acid, azelaic acid, sebacic acid, phthalic acid, isophthalic acid, terephthalic acid, fumaric acid, and any combination thereof. In order to provide heat resistance to the aromatic polyamide resin in addition to circuit adhesion, the dicarboxylic acid is preferably an aromatic dicarboxylic acid. Examples of the aromatic dicarboxylic acid include phthalic acid, isophthalic acid, terephthalic acid, fumaric acid, and any combination thereof. Particularly, an aromatic polyamide resin containing a phenolic hydroxyl group in the molecule is preferred. This aromatic polyamide resin may appropriately have in the molecule a chemical bond that provides flexibility to the aromatic polyamide resin as a soft chain, in a range that does not impair the heat resistance, or may be present as a crosslinkable polymer alloy with a polyamide resin partially in an aggregated state. Examples of compounds that provide a chemical bond that provides flexibility to the aromatic polyamide resin as a soft chain include butadiene, ethylene-propylene copolymers, styrene-butadiene copolymers, carboxylic acid butadiene copolymers, acrylonitrile-butadiene copolymers, polyurethanes, polychloroprene, and siloxanes. The use of the aromatic polyamide as described above can ensure the softness of the epoxy resin cured product to enhance the peel strength reliability, and can also improve the heat resistance.

Examples of the polyamide-imide resins include "VYLO-MAX HR11NN" and "VYLOMAX HR16NN" manufactured by Toyobo Co., Ltd., and "HPC-5000" and "HPC-3010" manufactured by Hitachi Chemical Company, Ltd.

The dielectric filler is a component that provides the desired high capacitance to the resin composition as a dielectric layer, and is preferably a complex metal oxide including at least two selected from the group consisting of Ba, Ti, Sr, Pb, Zr, La, Ta, and Bi. Preferred examples of the complex metal oxide include particles of $BaTiO_3$, $SrTiO_3$, $Pb(Zr,Ti)O_3$, $PbLaTiO_3$, $PbLaZrO$, $SrBi_2Ta_2O_9$, and any combination thereof, which have high capacitance and can be mixed into the resin composition of the present invention, more preferably $BaTiO_3$. $Pb(Zr,Ti)O_3$ means $Pb(Zr_xTi_{1-x})$ O₃, wherein 0≤x≤1, typically 0<x<1. The content of the dielectric filler (complex metal oxide) in the resin composition is preferably 70 parts by weight or more and 85 parts by weight or less, more preferably 75 parts by weight or more and 85 parts by weight or less, and further preferably 77 parts by weight or more and 82 parts by weight or less based on 100 parts by weight of the solids of the resin composition. The binder component (for example, the epoxy resin) that is liquid at ordinary temperature but solidifies by curing is included as the solids of the resin composition described above. The particle diameter of the dielectric filler is not particularly limited, but from the viewpoint of maintaining the adhesion between the resin composition and a copper foil, the average particle diameter $D_{50}$ measured by laser diffraction scattering type particle size distribution measurement is preferably 0.01 μm or more and 2.0 μm or less, more preferably 0.05 μm or more and 1.0 μm or less, and further preferably 0.1 μm or more and 0.5 μm or less.

The resin composition may further include a filler dispersing agent as desired. By further including the filler dispersing agent, the dispersibility of the dielectric filler can be improved when a resin varnish and the dielectric filler are kneaded. For the filler dispersing agent, a known one can be appropriately used, and the filler dispersing agent is not particularly limited. Examples of preferred filler dispersing agents include in addition to phosphonic acid type, cationic, carboxylic acid type, and anionic dispersing agents, which are ionic dispersing agents, ether type, ester type, sorbitan ester type, diester type, monoglyceride type, ethylene oxide addition type, ethylenediamine base type, and phenol type dispersing agents, which are nonionic dispersing agents. Other examples include coupling agents such as silane coupling agents, titanate coupling agents, and aluminate coupling agents.

The resin composition may further include a curing accelerator for epoxy resins as desired. Examples of the epoxy resin curing accelerator include imidazole-based curing accelerators, phosphorus compounds typified by triphenylphosphine, tertiary amine compounds typified by 2,4,6-tris(dimethylaminomethyl)phenol, and urea-based epoxy resin curing accelerators.

Resin-Attached Copper Foil

The resin composition of the present invention is preferably used as the resin of a resin-attached copper foil. By previously providing in the form of a resin-attached copper foil, a capacitor element and a capacitor-built-in printed wiring board can be efficiently manufactured without separately forming a resin layer or a dielectric layer. In other words, according to a preferred aspect of the present invention, a resin-attached copper foil including a copper foil and the resin composition provided on at least one surface of the copper foil is provided. Typically, the resin composition is in the form of a resin layer, and a copper foil is coated with the resin composition using a gravure coating method so that the thickness of the resin layer after drying is a predetermined value, and dried to obtain a resin-attached copper foil. This method of coating is arbitrary, and in addition to the gravure coating method, a die coating method, a knife coating method, and the like can be adopted. In addition, a doctor blade, a bar coater, or the like can also be used to perform coating. The resin composition in the resin-attached copper foil is preferably semi-cured from the viewpoint of laminating two resin-attached copper foils so that the resin compositions face each other, to form a dielectric layer.

The thickness of the resin layer is not particularly limited as long as the desired capacitance can be ensured when the resin layer is incorporated into a capacitor as a dielectric layer. The thickness of the resin layer is preferably 0.1 μm or more and 15 μm or less, more preferably 0.2 μm or more and 10 μm or less, particularly preferably 0.5 μm or more and 5 μm or less, and most preferably 1 μm or more and 4 μm or less. When the thickness is within these ranges, there are advantages such as easily achieving high capacitance, easily forming the resin layer by the application of the resin composition, and easily ensuring sufficient adhesion between the resin layer and the copper foil.

The copper foil may be a metal foil in an electrodeposited or rolled state (so-called raw foil) or may be in the form of a surface-treated foil having at least either one surface subjected to surface treatment. The surface treatment can be various types of surface treatments performed in order to improve or provide some properties (for example, rust proofing properties, moisture resistance, chemical resistance, acid resistance, heat resistance, and adhesion to a substrate) on the surface of the metal foil. The surface treatment may be performed on at least one surface of the metal foil or on both surfaces of the metal foil. Examples of the surface treatment performed on the copper foil include rust proofing treatment, silane treatment, roughening treatment, and barrier forming treatment.

The ten-point average roughness Rzjis on the surface of the copper foil on the resin layer side measured in accordance with JIS B0601-2001 is preferably 2.0 μm or less, more preferably 1.5 μm or less, further preferably 1.0 μm or less, and particularly preferably 0.5 μm or less. When the ten-point average roughness Rzjis is within such ranges, the thickness of the resin layer can be made thinner. The lower limit value of the ten-point average roughness Rzjis on the surface of the copper foil on the resin layer side is not particularly limited, but from the viewpoint of improving the adhesion to the resin layer, Rzjis is preferably 0.005 μm or more, more preferably 0.01 μm or more, and further preferably 0.05 μm or more.

The thickness of the copper foil is not particularly limited but is preferably 0.1 μm or more and 100 μm or less, more preferably 0.5 μm or more and 70 μm or less, further preferably 2 μm or more and 70 μm or less, particularly preferably 5 μm or more and 70 μm or less, and most preferably 10 μm or more and 35 μm or less. When the thickness is within these ranges, processes such as a modified semi-additive process (MSAP), a semi-additive process (SAP), and a subtractive process, which are general pattern forming methods for the formation of the wiring of printed wiring boards, can be adopted. However, when the thickness of the copper foil is, for example, 10 μm or less, and the like, the resin-attached copper foil of the present invention may be one in which a resin layer is formed on the copper foil surface of a carrier-attached copper foil including a release layer and a carrier for handleabililty improvement.

Dielectric Layer

The resin composition of the present invention is preferably cured into a dielectric layer. In other words, according to a preferred aspect of the present invention, a dielectric layer being a layer of the resin composition of the present invention that is cured is provided. The curing of the resin composition should be performed based on a known method and is preferably performed by hot vacuum pressing. The thickness of the dielectric layer is not particularly limited as long as the desired capacitance can be ensured. The thickness of the dielectric layer is preferably 0.2 μm or more and 30 μm or less, more preferably 0.5 μm or more and 20 μm or less, particularly preferably 1 μm or more and 10 μm or less, and most preferably 2 μm or more and 6 μm or less. When the thickness is within these ranges, there are advantages such as easily achieving high capacitance, easily forming the resin layer by the application of the resin composition, and easily ensuring sufficient adhesion between the resin layer and the copper foil.

Copper-Clad Laminate

The resin composition or the dielectric layer including the same according to the present invention is preferably applied to a copper-clad laminate. In other words, according to a preferred aspect of the present invention, a copper-clad laminate including a first copper foil, the dielectric layer, and a second copper foil in sequence is provided. By providing in the form of a copper-clad laminate, a capacitor element and a capacitor-built-in printed wiring board including the resin composition of the present invention as a dielectric layer can be desirably fabricated. The method for fabricating the copper-clad laminate is not particularly limited, and, for example, the copper-clad laminate can be manufactured by laminating two of the above-described resin-attached copper foils so that the resin layers face each other, and vacuum-pressing them at high temperature.

Capacitor Element and Capacitor-Built-In Printed Wiring Board

The resin composition or the dielectric layer including the same according to the present invention is preferably incorporated into a capacitor element. In other words, according to a preferred aspect of the present invention, a capacitor element including the dielectric layer is provided. The configuration of the capacitor element is not particularly limited, and a known configuration can be adopted. A particularly preferred form is a capacitor-built-in printed wiring board in which a capacitor or its dielectric layer is incorporated as an inner layer portion of a printed wiring board. In other words, according to a particularly preferred aspect of the present invention, a capacitor-built-in printed wiring board including the dielectric layer is provided. Particularly, the use of the resin-attached copper foil of the present invention makes it possible to efficiently manufacture a capacitor element and a capacitor-built-in printed wiring board based on a known method.

EXAMPLES

The present invention will be more specifically described by the following examples.

Examples 1 to 11

(1) Preparation of Resin Varnish

First, as raw material components for resin varnishes, the binder components, the curing accelerator, the dielectric filler, and the dispersing agent shown below were provided.

Epoxy resin 1: bisphenol A type epoxy resin, manufactured by Mitsubishi Chemical Corporation, jER828 (epoxy equivalent 189 g/eq)

Epoxy resin 2: manufactured by DIC CORPORATION, EXA-4850-150 (epoxy equivalent 450 g/eq)

Epoxy resin 3: phenol novolac type epoxy resin, manufactured by NIPPON STEEL & SUMIKIN CHEMICAL CO., LTD., YDPN-638 (epoxy equivalent 180 g/eq)

Bisphenol S: reagent (manufactured by FUJIFILM Wako Pure Chemical Corporation)

Bisphenol A: reagent (manufactured by FUJIFILM Wako Pure Chemical Corporation)

Epoxy resin curing agent 1 having phenolic hydroxyl group: manufactured by Meiwa Plastic Industries, Ltd., MEH-7000 (phenol equivalent 143 g/Eq)

Epoxy resin curing agent 2 having phenolic hydroxyl group: manufactured by Meiwa Plastic Industries, Ltd., MEH-7500 (phenol equivalent 97 g/Eq)

Epoxy resin curing agent 3 having phenolic hydroxyl group: manufactured by Meiwa Plastic Industries, Ltd., MEHC-7851 (phenol equivalent 210 g/Eq)

Epoxy resin curing agent 4 having phenolic hydroxyl group: manufactured by Maruzen Petrochemical Co., Ltd., MARUKA LYNCUR M S-1 (phenol equivalent 120 g/Eq)

Epoxy resin curing agent (amine-based) 1 having no phenolic hydroxyl group: manufactured by Wakayama Seika Kogyo Co., Ltd., BAPP (2,2-bis(4-(4-aminophenoxy)phenyl)propane, active hydrogen group equivalent 102 g/Eq)

Epoxy resin curing agent (amine-based) 2 having no phenolic hydroxyl group: manufactured by Wakayama Seika Kogyo Co., Ltd., BAPS, active hydrogen group equivalent 108 g/Eq Aromatic polyamide resin (polymer): manufactured by Nippon Kayaku Co., Ltd., BPAM-155 (phenolic hydroxyl group-containing polybutadiene-modified aromatic polyamide resin)

Polyimide resin (polymer): manufactured by Arakawa Chemical Industries, Ltd., PIAD-301

Epoxy resin curing accelerator: manufactured by Nippon Soda Co., Ltd., 2P4MHZ

Dielectric filler: $BaTiO_3$, manufactured by Nippon Chemical Industrial Co., Ltd., AKBT-S, average particle diameter $D_{50}$ measured by laser diffraction scattering type particle size distribution measurement=0.3 μm Dispersing agent: titanate-based coupling agent, manufactured by Ajinomoto Fine-Techno Co., Inc., KR-44

The raw material components for a resin varnish were weighed in a blending ratio (weight ratio) shown in Table 1. Then, a cyclopentanone solvent was weighed, and the raw material components for a resin varnish and the cyclopentanone were charged into a flask and stirred at 60° C. After it was confirmed that the resin varnish was transparent, the resin varnish was collected.

(2) Kneading with Filler

A cyclopentanone solvent, the dielectric filler, and the dispersing agent were each weighed. The weighed solvent, dielectric filler, and dispersing agent were slurried by a dispersing machine. After this slurrying was confirmed, the resin varnish was weighed and kneaded with the dielectric filler-containing slurry by the dispersing machine to obtain a resin composition.

(3) Resin Coating

A copper foil 2 (manufactured by MITSUI MINING & SMELTING CO., LTD., thickness 18 μm, surface roughness Rzjis=0.5 μm) was coated with the obtained resin composition 4, as shown in FIG. 1, using a bar coater so that the thickness of the resin layer after drying was 1.5 μm, and then dried in an oven heated to 130° C. for 3 minutes to bring the resin into a semi-cured state. Thus, a resin-attached copper foil 6 was obtained.

(4) Pressing

Two resin-attached copper foils 6 were laminated so that the resin compositions faced each other, as shown in FIG. 1, and vacuum-pressed at a pressure of 40 kgf/cm² and 200° C. for 90 minutes to bring the resin composition into a cured state. Thus, a copper-clad laminate 8 which included the cured resin composition as a dielectric layer and in which the thickness of the dielectric layer was 3.0 μm was obtained.

(5) Circuit Formation and Evaluation

One surface of the obtained copper-clad laminate 8 was etched to form circuits 10 for various types of evaluations, and the following various types of evaluations were performed.

<Evaluation 1: Peel Strength (Circuit Adhesion)>

One surface of the copper-clad laminate 8 was etched to fabricate a 3 mm wide linear circuit 10, and then the circuit 10 was peeled at a peel rate of 50 mm/minute by Autograph, and the peel strength was measured. This measurement was performed in accordance with IPC-TM-650 2.4.8. The results were as shown in Table 1.

<Evaluation 2: Capacitance>

One surface of the copper-clad laminate 8 was etched to fabricate a circular circuit having a diameter of 0.5 inches (12.6 mm), and then the capacitance at a frequency of 1 kHz was measured by an LCR meter (manufactured by HIOKI E.E. CORPORATION, LCR HiTESTER 3532-50). This measurement was performed in accordance with IPC-TM-650 2.5.2. The results were as shown in Table 1.

<Evaluation 3: Voltage Endurance>

One surface of the copper-clad laminate 8 was etched to fabricate a circular circuit having a diameter of 0.5 inches (12.6 mm), and then the breakdown voltage in direct current was measured by a voltage endurance tester (manufactured by Associated Research, Inc., HypotULTRA® μl MODEL 7650). This measurement was performed in accordance with IPC-TM-650 2.5.6.3. The results were as shown in Table 1.

TABLE 1

| | | | | Ex. 1 | Ex. 2 | Ex. 3 | Ex. 4 | Ex. 5 | Ex. 6 | Ex. 7 | Ex. 8 | Ex. 9* | Ex. 10* | Ex. 11* |
|---|---|---|---|---|---|---|---|---|---|---|---|---|---|---|
| Resin composition | Binder component blending ratio (parts by weight based on 100 parts by weight of binder component) | Epoxy resin | jER828 | 60 | 60 | 63 | 50 | 43 | 50 | 56 | 63 | 63 | 60 | 31 |
| | | | EXA-4850-150 | | | | | | 10 | | | | | |
| | | | YDPN-638 | | | | 9 | | | | | | | |
| | | Bisphenol S | (Reagent) | 30 | 30 | 22 | 37 | 23 | 30 | 28 | 19 | | 33 | 14 |
| | | Bisphenol A | (Reagent) | | | | | | | | | 31 | | |
| | | Epoxy resin curing agent (phenolic) | MEH-7000 | 10 | | | | | | | | | | |
| | | | MEH-7500 | | | 15 | 4 | 4 | | 7 | 18 | 6 | | |
| | | | MEHC-7851 | | | | | | 10 | | | | | |
| | | | MARUKA LYNCUR M S-1 | | 10 | | | | | | | | | |
| | | Epoxy resin curing agent (amine-based) | BAPP | | | | | | | | | | | 5 |
| | | | BAPS | | | | | | | | | | 7 | |
| | | Aromatic polyamide resin | BPAM-155 | | | | | 30 | | | | | | |
| | | Polyimide resin | PIAD-301 | | | | | | | | 9 | | | 50 |
| | Epoxy resin curing accelerator | 2P4MHZ | | 1 | 1 | 1 | 1 | 1 | 1 | 1 | 1 | 1 | 1 | 1 |
| | Dielectric filler content (parts by weight based on 100 parts by weight of solids of resin composition) | | | 78 | 78 | 78 | 78 | 78 | 78 | 78 | 78 | 78 | 78 | 78 |
| Evaluation results | Evaluation 1 | Peel strength (kgf/cm) | | 1.0 | 0.9 | 0.8 | 0.8 | 1.2 | 0.8 | 0.8 | 0.6 | 0.5 | 1.0 | 1.2 |
| | Evaluation 2 | Capacitance @1 KHz (nF/in²) Dielectric layer thickness @4 μm | | 36 | 33 | 33 | 37 | 38 | 36 | 36 | 35 | 36 | 33 | 27 |
| | Evaluation 3 | Voltage Endurance (V) | | 500 | 350 | 510 | 290 | 300 | 440 | 300 | 510 | 500 | 110 | 110 |

*indicates a comparative example.

The invention claimed is:

1. A resin composition comprising:
   a binder component consisting of:
      bisphenol S blended in the resin composition as an unreacted monomer,
      an epoxy resin curing agent having a phenolic hydroxyl group,
      optionally, a polymer component, and
      an epoxy resin; and
   a dielectric filler;
   wherein
      the polymer component content is 0 parts by weight or more and 15 parts by weight or less based on 100 parts by weight of the binder component, and
      the polymer component is selected from the group consisting of polyimide resins, polyamide resins, and polyamide-imide resins.

2. The resin composition according to claim 1, wherein the epoxy resin curing agent having a phenolic hydroxyl group has three or more phenolic hydroxyl groups per molecule.

3. The resin composition according to claim 1, wherein the binder component comprises 20 parts by weight or more and 40 parts by weight or less of the bisphenol S based on 100 parts by weight of the binder component.

4. The resin composition according to claim 1, comprising at least one polymer component selected from the group consisting of polyimide resins, polyamide resins, and polyamide-imide resins.

5. The resin composition according to claim 1, wherein the dielectric filler is a complex metal oxide comprising at least two selected from the group consisting of Ba, Ti, Sr, Pb, Zr, La, Ta, and Bi, in an amount of 70 parts by weight or more and 85 parts by weight or less based on 100 parts by weight of solids of the resin composition.

6. The resin composition according to claim 5, wherein the complex metal oxide comprises at least one selected from the group consisting of $BaTiO_3$, $SrTiO_3$, $Pb(Zr,Ti)O_3$, $PbLaTiO_3$, PbLaZrO, and $SrBi_2Ta_2O_9$.

7. The resin composition according to claim 5, comprising 75 parts by weight or more and 85 parts by weight or less of the complex metal oxide based on 100 parts by weight of the solids of the resin composition.

8. The resin composition according to claim 1, wherein the binder component comprises 1 part by weight or more and 25 parts by weight or less of the epoxy resin curing agent having a phenolic hydroxyl group based on 100 parts by weight of the binder component.

9. The resin composition according to claim 1, wherein the epoxy resin has two or more epoxy groups per molecule.

10. The resin composition according to claim 1, wherein the binder component comprises 30 parts by weight or more and 80 parts by weight or less of the epoxy resin based on 100 parts by weight of the binder component.

11. The resin composition according to claim 1, wherein a copper-clad laminate obtained using the resin composition has a peel strength of 0.8 kgf/cm or more.

12. A resin-attached copper foil comprising a copper foil and the resin composition according to claim 1 provided on at least one surface of the copper foil.

13. A dielectric layer being a layer of the resin composition according to claim 1 that is cured.

14. The dielectric layer according to claim 13, having a thickness of 0.2 μm or more and 30 μm or less.

15. A copper-clad laminate comprising a first copper foil, the dielectric layer according to claim 13, and a second copper foil in sequence.

16. A capacitor element comprising the dielectric layer according to claim 13.

17. A capacitor-built-in printed wiring board comprising the dielectric layer according to claim 13.

* * * * *

UNITED STATES PATENT AND TRADEMARK OFFICE
CERTIFICATE OF CORRECTION

| | | |
|---|---|---|
| PATENT NO. | : 12,351,698 B2 | Page 1 of 1 |
| APPLICATION NO. | : 17/442339 | |
| DATED | : July 8, 2025 | |
| INVENTOR(S) | : Toshihiro Hosoi et al. | |

It is certified that error appears in the above-identified patent and that said Letters Patent is hereby corrected as shown below:

In the Claims

Column 12, Line 28 (Claim 6, Line 4), the chemical formula should read "$SrBi_2Ta_2O_9$" instead of $SrBi_2Ta_{2O9}$ Signed and Sealed this
Thirtieth Day of September, 2025

John A. Squires
*Director of the United States Patent and Trademark Office*